(12) United States Patent
Wu et al.

(10) Patent No.: US 11,852,844 B2
(45) Date of Patent: Dec. 26, 2023

(54) OPTICAL SYSTEM

(71) Applicant: TDK TAIWAN CORP., Taoyuan (TW)

(72) Inventors: Fu-Yuan Wu, Taoyuan (TW); Yu-Shan Chou, Taoyuan (TW); Chen-Hsin Huang, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 358 days.

(21) Appl. No.: 16/851,786

(22) Filed: Apr. 17, 2020

(65) Prior Publication Data

US 2020/0333555 A1    Oct. 22, 2020

Related U.S. Application Data

(60) Provisional application No. 62/836,405, filed on Apr. 19, 2019.

(51) Int. Cl.
*G02B 7/09* (2021.01)
*G02B 27/64* (2006.01)
(Continued)

(52) U.S. Cl.
CPC ........... *G02B 27/646* (2013.01); *G02B 7/003* (2013.01); *G02B 7/08* (2013.01); *G02B 7/09* (2013.01); *G02B 7/1821* (2013.01); *G03B 5/00* (2013.01); *G03B 5/02* (2013.01); *G03B 5/04* (2013.01); *G03B 13/36* (2013.01); *H01L 27/14618* (2013.01); *H01L 27/14636* (2013.01); *H01L 31/02002* (2013.01); *H01L 31/024* (2013.01); *H01L 31/02016* (2013.01); *H01L 31/02327* (2013.01); *H01L 31/02366* (2013.01); *H01L 31/022466* (2013.01); *H01L 31/1136* (2013.01); *H02K 11/21* (2016.01); *H02K 41/0356* (2013.01); *H04N 23/54* (2023.01);
(Continued)

(58) Field of Classification Search
CPC . G02B 7/021; G02B 7/08; G02B 7/09; G02B 7/10; G02B 9/62; G02B 13/001; G02B 13/0065; G02B 27/646; H04N 5/2253; H04N 5/2254; H04N 5/2257; H04N 5/23287; G03B 2205/0007; G03B 2205/0053; G03B 2205/0069; G03B 3/02; G03B 3/10; G03B 5/00; G03B 5/04; G03B 13/36; G03B 30/00; H02K 11/21; H02K 11/33; H02K 41/0354; H02K 41/0356
USPC ....... 359/911, 544, 555, 557, 811, 813, 814, 359/872, 877; 396/52, 55
See application file for complete search history.

(56) References Cited

U.S. PATENT DOCUMENTS

| 2012/0154614 | A1* | 6/2012 | Moriya | G02B 27/646 |
| | | | | 348/208.5 |
| 2016/0131923 | A1* | 5/2016 | Hu | G02B 7/10 |
| | | | | 359/557 |

(Continued)

*Primary Examiner* — Marin Pichler
(74) *Attorney, Agent, or Firm* — Muncy, Geissler, Olds & Lowe (57) ABSTRACT

An optical system is provided and includes a fixed assembly, an optical module, a first movable assembly and a first driving assembly. The optical module has an optical axis. The first movable assembly is configured to be connected to the optical module. The first driving assembly is configured to drive the first movable assembly to move relative to the fixed assembly, and a gap is formed between the first movable assembly and the fixed assembly.

21 Claims, 8 Drawing Sheets

(51) Int. Cl.
  *G03B 13/36* (2021.01)
  *G03B 5/00* (2021.01)
  *H02K 11/21* (2016.01)
  *H02K 41/035* (2006.01)
  *H01L 31/0232* (2014.01)
  *H01L 31/113* (2006.01)
  *H01L 31/0236* (2006.01)
  *H01L 31/02* (2006.01)
  *H01L 27/146* (2006.01)
  *H01L 31/0224* (2006.01)
  *H01L 31/024* (2014.01)
  *G03B 5/02* (2021.01)
  *G03B 5/04* (2021.01)
  *G02B 7/182* (2021.01)
  *G02B 7/00* (2021.01)
  *G02B 7/08* (2021.01)
  *H04N 23/54* (2023.01)
  *H04N 23/55* (2023.01)
  *H04N 23/57* (2023.01)
  *G02B 13/00* (2006.01)
  *H01L 23/00* (2006.01)

(52) U.S. Cl.
  CPC ............. *H04N 23/55* (2023.01); *H04N 23/57* (2023.01); *G02B 13/0045* (2013.01); *G03B 2205/0007* (2013.01); *G03B 2205/0069* (2013.01); *H01L 24/48* (2013.01); *H01L 2224/48091* (2013.01); *H01L 2224/48106* (2013.01); *H01L 2224/48225* (2013.01)

(56) References Cited

U.S. PATENT DOCUMENTS

2017/0115466 A1* 4/2017 Murakami ............ G02B 27/646
2020/0166770 A1* 5/2020 Lee ........................... G02B 7/08
2020/0260011 A1* 8/2020 Sasaki .................. G02B 27/646

* cited by examiner

OPTICAL SYSTEM

CROSS REFERENCE TO RELATED APPLICATIONS

This application claims the benefit of U.S. Provisional Application No. 62/836,405, filed Apr. 19, 2019, the entirety of which is incorporated by reference herein.

BACKGROUND OF THE DISCLOSURE

Field of the Disclosure

The present disclosure relates to an optical system, and in particular it relates to an optical system capable of compensating images by rotating the optical element.

Description of the Related Art

As technology has progressed, many kinds of electronic devices such as tablet computers have begun to include the functionality of digital photography or video recording. A user can operate the electronic device to capture various images with an optical system (such as a camera module) that is included in the electronic device.

Today's design of electronic devices continues to move toward the trend of miniaturization so that the various components of the camera module or its structure must also be continuously reduced, so as to achieve the purpose of miniaturization. In general, a driving mechanism of the camera module has a camera lens holder configured to hold a camera lens, and the driving mechanism can have the functions of auto focusing or optical image stabilization. However, although the existing driving mechanism can achieve the aforementioned functions of photographing or video recording, they still cannot meet all the needs.

Therefore, how to design a camera module that can perform the functions of auto focusing and optical image stabilization at the same time and can achieve miniaturization is a topic nowadays that needs to be discussed and solved.

BRIEF SUMMARY OF THE DISCLOSURE

Accordingly, one objective of the present disclosure is to provide an optical system to solve the above problems.

According to some embodiments, an optical system is provided and includes a fixed assembly, an optical module, a first movable assembly and a first driving assembly. The optical module has an optical axis. The first movable assembly is configured to be connected to the optical module. The first driving assembly is configured to drive the first movable assembly to move relative to the fixed assembly, and a gap is formed between the first movable assembly and the fixed assembly.

According to some embodiments, the optical module further includes a second movable assembly, a photosensitive element and a second driving assembly. The second movable assembly is configured to be connected to an optical element. The photosensitive element corresponds to the optical element. The second driving assembly is configured to drive the second movable assembly to move relative to the first movable assembly and the fixed assembly, and when viewed in a direction perpendicular to the optical axis, the first driving assembly overlaps at least one portion of the second driving assembly.

According to some embodiments, when viewed along the optical axis, the first driving assembly does not overlap the second driving assembly.

According to some embodiments, the first driving assembly further includes a first driving magnet and a first driving coil, and when viewed in a direction perpendicular to the optical axis, the first driving magnet does not overlap and the first driving coil.

According to some embodiments, the first driving assembly includes a first driving coil and a first driving magnet. The first driving coil includes a first linear segment and a second linear segment, wherein each of the first linear segment and the second linear segment has a linear structure, and the first linear segment is neither parallel nor perpendicular to the second linear segment. The first driving magnet corresponds to the first driving coil.

According to some embodiments, the first driving magnet has an arc-shaped surface.

According to some embodiments, the first driving assembly is configured to drive the first movable assembly to rotate around a first axis relative to the fixed assembly, and the first axis is parallel to the optical axis.

According to some embodiments, the optical system further includes a circuit assembly which has a plate-shaped structure and is electrically connected to the optical module, and a thickness direction of the circuit assembly is not parallel to the optical axis.

According to some embodiments, the optical system further includes a first elastic element and a second elastic element, the first elastic element has a long strip-shaped structure, the second elastic element has a plate-shaped structure, and the first movable assembly is movably connected to the fixed assembly via the first elastic element and the second elastic element.

According to some embodiments, the optical module further includes a second movable assembly, a photosensitive element, a second driving assembly a third elastic element and a fourth elastic element. The second movable assembly is configured to be connected to an optical element. The photosensitive element corresponds to the optical element. The second driving assembly is configured to drive the second movable assembly to move relative to the first movable assembly and the fixed assembly. The third elastic element has a long strip-shaped structure. The fourth elastic element has a plate-shaped structure, wherein the second movable assembly is movably connected to the first movable assembly via the third elastic element and the fourth elastic element.

According to some embodiments, extending directions of the first elastic element and the third elastic element are parallel.

According to some embodiments, the second driving assembly is electrically connected to the first elastic element, the second elastic element, the third elastic element, and the fourth elastic element.

According to some embodiments, the first driving assembly is electrically connected to the first elastic element and the second elastic element.

According to some embodiments, The optical system further includes a first position sensing assembly configured to sense movement of the first movable assembly relative to the fixed assembly, and the first position sensing assembly is electrically connected to the first elastic element and the second elastic element.

According to some embodiments, the first position sensing assembly includes a first position sensor, which is fixedly disposed on the first movable assembly.

According to some embodiments, the first driving assembly includes two first driving magnets, and when viewed along the optical axis, the two first driving magnets are disposed on two opposite sides of the optical module.

According to some embodiments, the first driving assembly includes two sets of first driving magnets, and when viewed along the optical axis, the two sets of first driving magnets are respectively disposed on two opposite sides of the optical module.

According to some embodiments, the first driving assembly includes two magnetic conductive elements, and the two sets of first driving magnets are respectively disposed in the two magnetic conductive elements.

According to some embodiments, each set of first driving magnets may include two first driving magnets, and the first driving assembly further includes a first driving coil disposed between the two first driving magnets.

According to some embodiments, the optical system further includes a control circuit configured to control the first driving assembly to drive the first movable assembly to move relative to the fixed assembly according to an image signal or an inertial signal.

The present disclosure provides an optical system disposed in an electronic device. The optical system includes the optical module, the supporting frame, the first elastic elements, the second elastic elements, the first driving assembly, and the base. The supporting frame is configured to support the optical module, and the supporting frame is movably connected to the base via the first elastic elements and the second elastic elements. When the user uses the electronic device to take pictures and the electronic device is not placed horizontally, the first driving assembly can drive the supporting frame with the optical module to rotate around the optical axis, so as to achieve the purpose of image compensation.

In addition, the circuit assembly of the present disclosure is a flexible circuit board, and the thickness direction of the circuit assembly is not parallel to the optical axis. Because the circuit assembly is flexible, when the optical module rotates around the optical axis, the circuit assembly does not break.

Additional features and advantages of the disclosure will be set forth in the description which follows, and, in part, will be obvious from the description, or can be learned by practice of the principles disclosed herein. The features and advantages of the disclosure can be realized and obtained by means of the instruments and combinations pointed out in the appended claims. These and other features of the disclosure will become more fully apparent from the following description and appended claims, or can be learned by the practice of the principles set forth herein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE ILLUSTRATIVE EMBODIMENTS

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Figure 1:
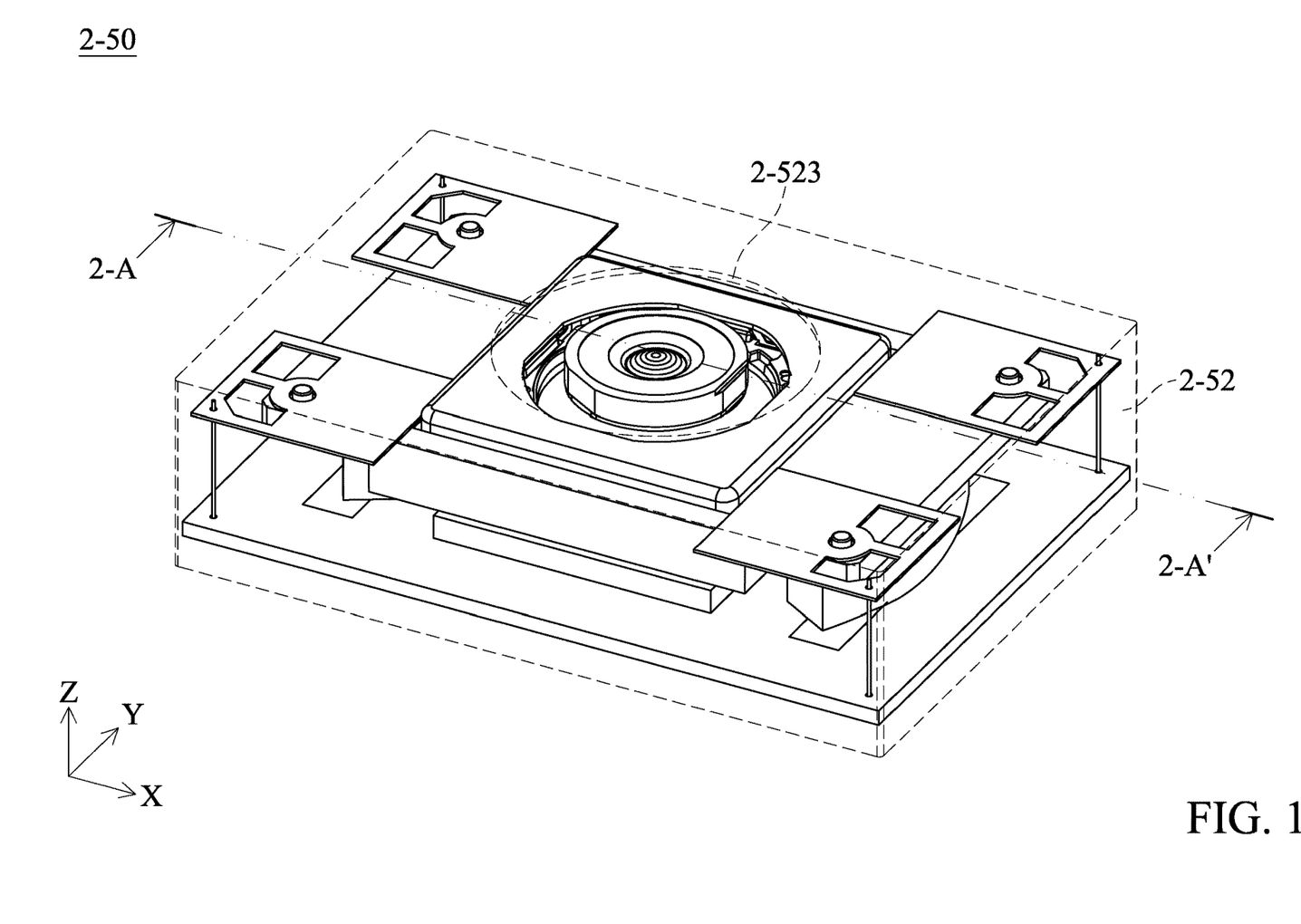
FIG. 1 shows a schematic diagram of an optical system 2-50 according to an embodiment of the present disclosure.
Figure 2:
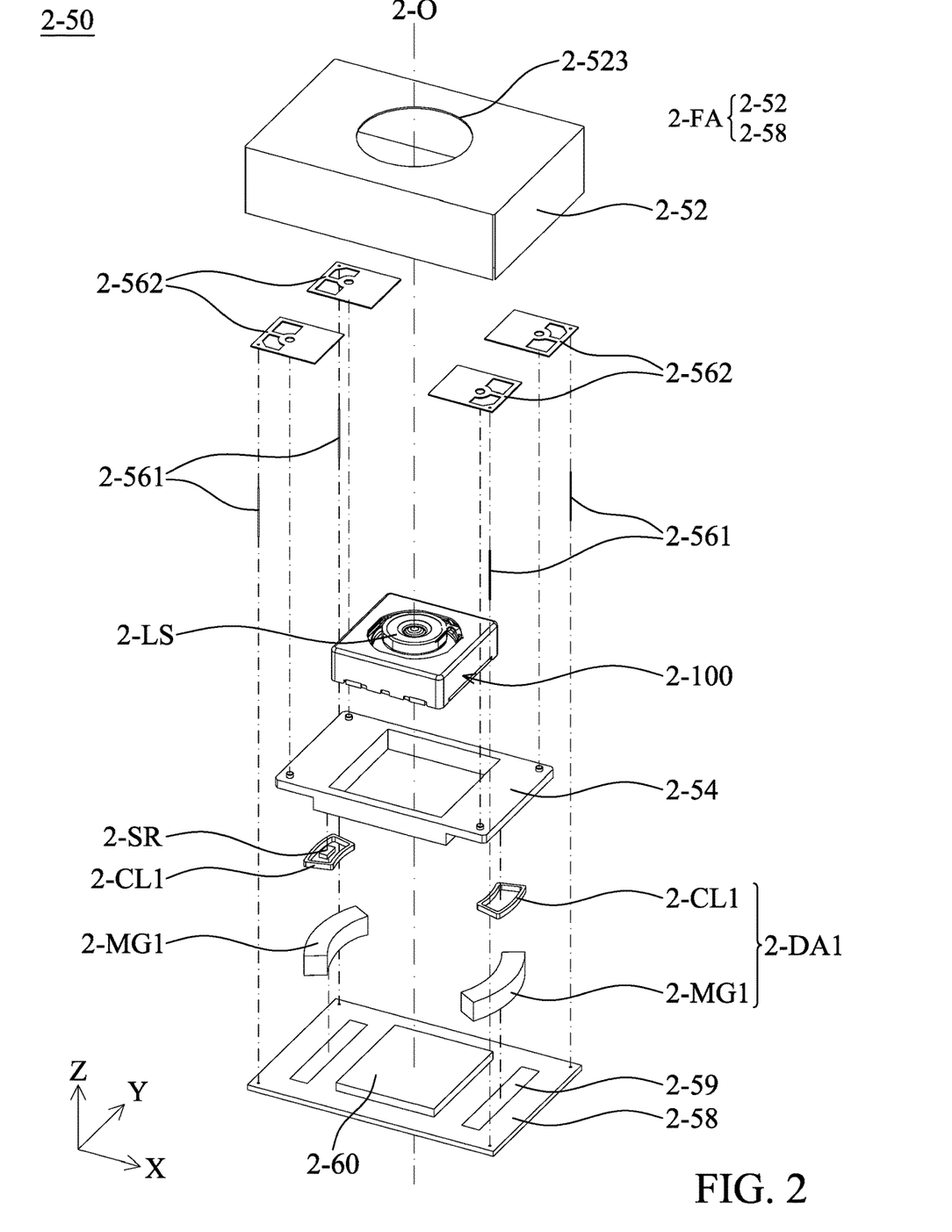
FIG. 2 shows an exploded diagram of the optical system 2-50 according to an embodiment of the present disclosure.
Figure 3:
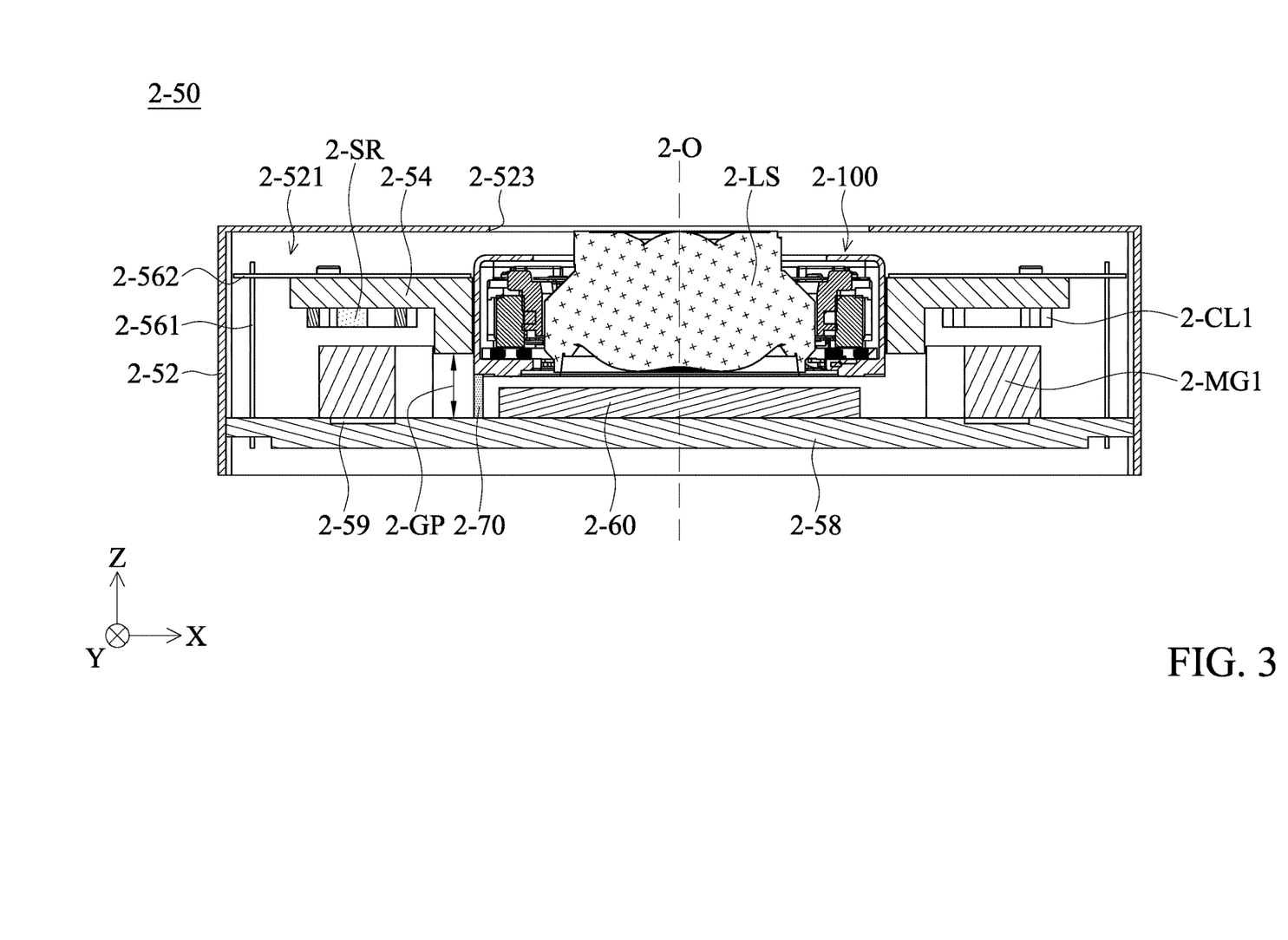
FIG. 3 shows a cross-sectional view along line 2-A-2-A' in FIG. 1 according to an embodiment of the present disclosure.

Please refer to FIG. 1 to FIG. 3. FIG. 1 shows a schematic diagram of an optical system 2-50 according to an embodiment of the present disclosure, FIG. 2 shows an exploded diagram of the optical system 2-50 according to an embodiment of the present disclosure, and FIG. 3 shows a cross-sectional view along line 2-A-2-A' in FIG. 1 according to an embodiment of the present disclosure. The optical system 2-50 can be an optical camera system and can be configured to hold and drive optical element 2-LS. The optical system 2-50 can be installed in different electronic devices or portable electronic devices, such as a smartphone, for allowing a user to perform the image capturing function. In this embodiment, the optical system 2-50 can be a voice coil motor (VCM) with an auto-focusing (AF) function, but it is not limited thereto. In other embodiments, the optical system 2-50 can also perform the functions of auto-focusing and optical image stabilization (OIS).

In this embodiment, the optical system 2-50 may include a fixed assembly 2-FA, an optical module 2-100, a first movable assembly, and a first driving assembly 2-DA1. The first movable assembly is connected to the optical module 2-100 for holding the optical module 2-100, and an optical element 2-LS held by the optical module 2-100 has an optical axis 2-O. The first driving assembly 2-DA1 is configured to drive the first movable assembly to move relative to the fixed assembly 2-FA.

In this embodiment, as shown in FIG. 2, the fixed assembly 2-FA includes a casing 2-52 and a base 2-58. The casing 2-52 is fixedly connected to the base 2-58 to form an accommodating space 2-521 to accommodate other components of the optical system 2-50. The first movable assembly includes a supporting frame 2-54 configured to hold the optical module 2-100. In other embodiments, the first movable assembly may contain other elements.

As shown in FIG. 3, the casing 2-52 has a first opening 2-523, and the center of the first opening 2-523 corresponds to the optical axis 2-O of the optical module 2-100. The optical system 2-50 may further include a photosensitive element 2-60 disposed on the base 2-58, and the optical module 2-100 corresponds to the photosensitive element 2-60. The external light enters the casing 2-52 through the first opening 2-523, passes through the optical element 2-LS in the optical module 2-100, and then is received by the aforementioned photosensitive element 2-60 so as to generate a digital image signal.

In this embodiment, the optical system 2-50 may further include four first elastic elements 2-561 and four second elastic elements 2-562, the first elastic element 2-561 has a long strip-shaped structure, the second elastic element 2-562 has a plate-shaped structure, and the first movable assembly (the supporting frame 2-54) is movably connected to the base 2-58 via the first elastic elements 2-561 and the second elastic elements 2-562.

Specifically, inner portions of the second elastic elements 2-562 are fixed to the supporting frame 2-54, the first elastic elements 2-561 are connected between outer portions of the second elastic elements 2-562 and the base 2-58 so that the supporting frame 2-54 and the optical module 2-100 can be suspended in the accommodating space 2-521.

In this embodiment, the first driving assembly 2-DA1 may include at least one first driving magnet 2-MG1 and at least one first driving coil 2-CL1. The first driving coil 2-CL1 is disposed on the bottom of the supporting frame 2-54, and the first driving magnet 2-MG1 is disposed on the base 2-58 and faces the first driving coil 2-CL1. In other embodiments, the positions of the first driving coil 2-CL1 and the first driving magnet 2-MG1 may be interchanged.

It is worth noting that, as shown in FIG. 3, the first driving magnets 2-MG1 do not overlap and the first driving coils 2-CL1 when viewed in a direction perpendicular to the optical axis 2-O (such as in the Y-axis). In addition, there is a gap 2-GP between the supporting frame 2-54 and the base 2-58 for fixed assembly 2-FA.

Figure 4:
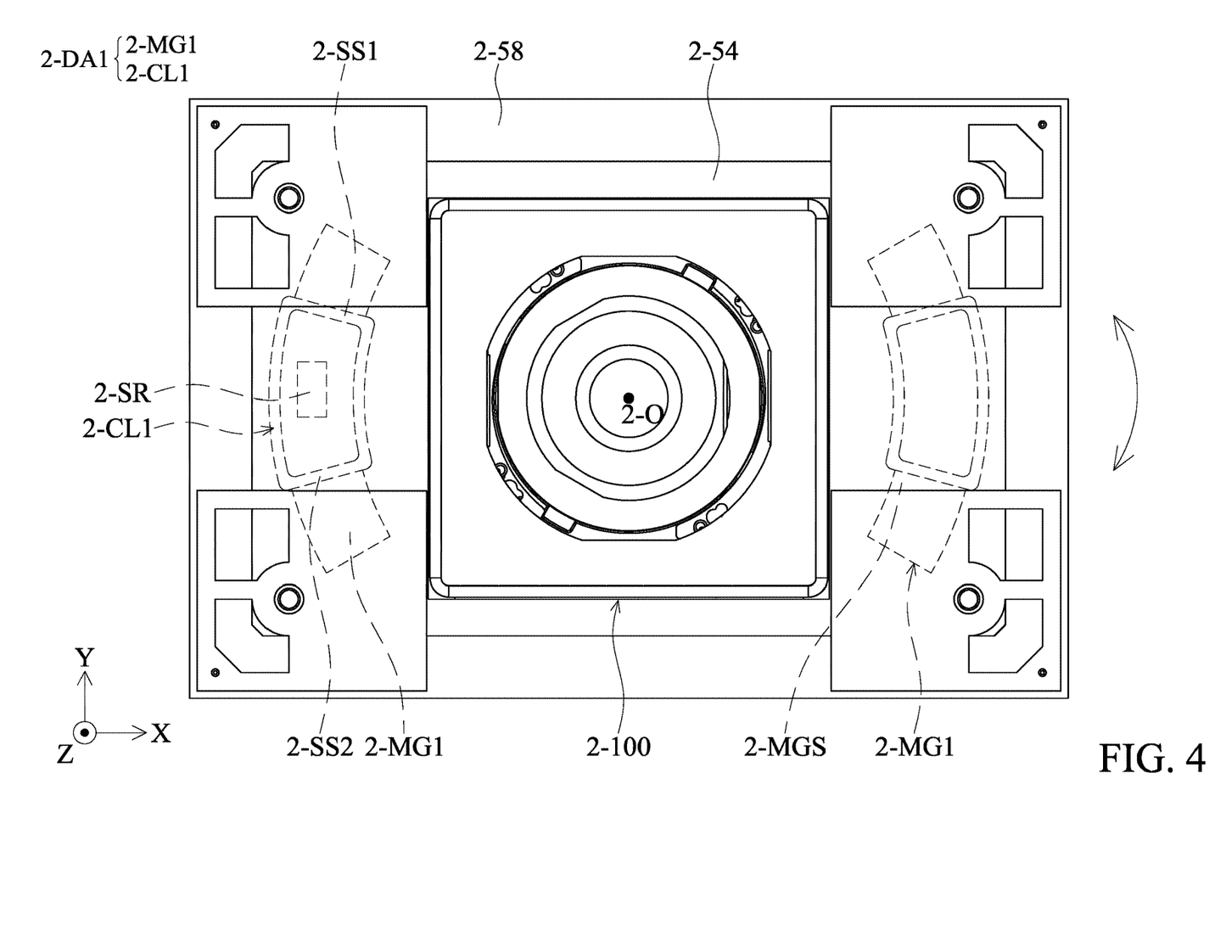
FIG. 4 is a top view of a partial structure of the optical system 2-50 according to an embodiment of the present disclosure.

Please refer to FIG. 3 and FIG. 4. FIG. 4 is a top view of a partial structure of the optical system 2-50 according to an embodiment of the present disclosure. In this embodiment, the first driving assembly 2-DA1 includes two first driving magnets 2-MG1, and when viewed along the optical axis 2-O, the two first driving magnets 2-MG1 are disposed on two opposite sides of the optical module 2-100. It should be noted that there is no first driving magnet 2-MG1 disposed on the other two sides (the upper and lower sides) of the optical module 2-100 so as to achieve the purpose of miniaturization.

The first driving coil 2-CL1 may be a winding coil having a first linear segment 2-SS1 and a second linear segment 2-SS2 with a linear structure, and the first linear segment 2-SS1 is neither parallel nor perpendicular to the second linear segment 2-SS2. The first driving magnet 2-MG1 has an arc-shaped surface 2-MGS, corresponding to the shape of the first driving coil 2-CL1.

When the first driving coils 2-CL1 are provided with electricity, they may act with the first driving magnets 2-MG1 to generate an electromagnetic driving force to drive the supporting frame 2-54 (the first movable assembly) and the optical module 2-100 to rotate around the optical axis 2-O or around a first axis parallel to the optical axis 2-O relative to the base 2-58 of the fixed assembly 2-FA. In addition, as shown in FIG. 3, two magnetic conductive elements 2-59 may be disposed on the base 2-58 to increase the driving ability of the first driving assembly 2-DA1.

As shown in FIG. 3, the optical system 2-50 may further include a circuit assembly 2-70 which has a plate-shaped structure and is electrically connected to the optical module 2-100. In addition, the circuit assembly 2-70 may also be connected to metal wires (not shown) in the base 2-58 so that the circuit assembly 2-70 is electrically connected to an external circuit. The circuit assembly 2-70 is a flexible circuit board, and a thickness direction (the X-axis) of the circuit assembly 2-70 is not parallel to the optical axis 2-O. Because the circuit assembly 2-70 is flexible, when the optical module 2-100 rotates around the optical axis 2-O, the circuit assembly 2-70 does not break.

The optical system 2-50 may further include a first position sensing assembly configured to sense the movement of the supporting frame 2-54 (the first movable assembly) relative to the fixed assembly 2-FA, and the first position sensing assembly can be electrically connected to the first elastic elements 2-561 and the second elastic elements 2-562. Specifically, as shown in FIG. 3, the first position sensing assembly includes a first position sensor 2-SR, which is fixedly disposed on the supporting frame 2-54 and configured to sense the change in the magnetic field of the first driving magnets 2-MG1 so as to obtain the position or angle of the supporting frame 2-54 relative to the base 2-58.

In some embodiments, the first position sensing assembly may further include an inertial sensor (not shown in the figures), and the optical system 2-50 may further include a control circuit (not shown in the figure) configured to control the first driving assembly 2-DA1 to drive the supporting frame 2-54 to move relative to the base 2-58 according to an image signal captured in advance by the optical system 2-50 or an inertial signal from the inertial sensor.

Figure 5:
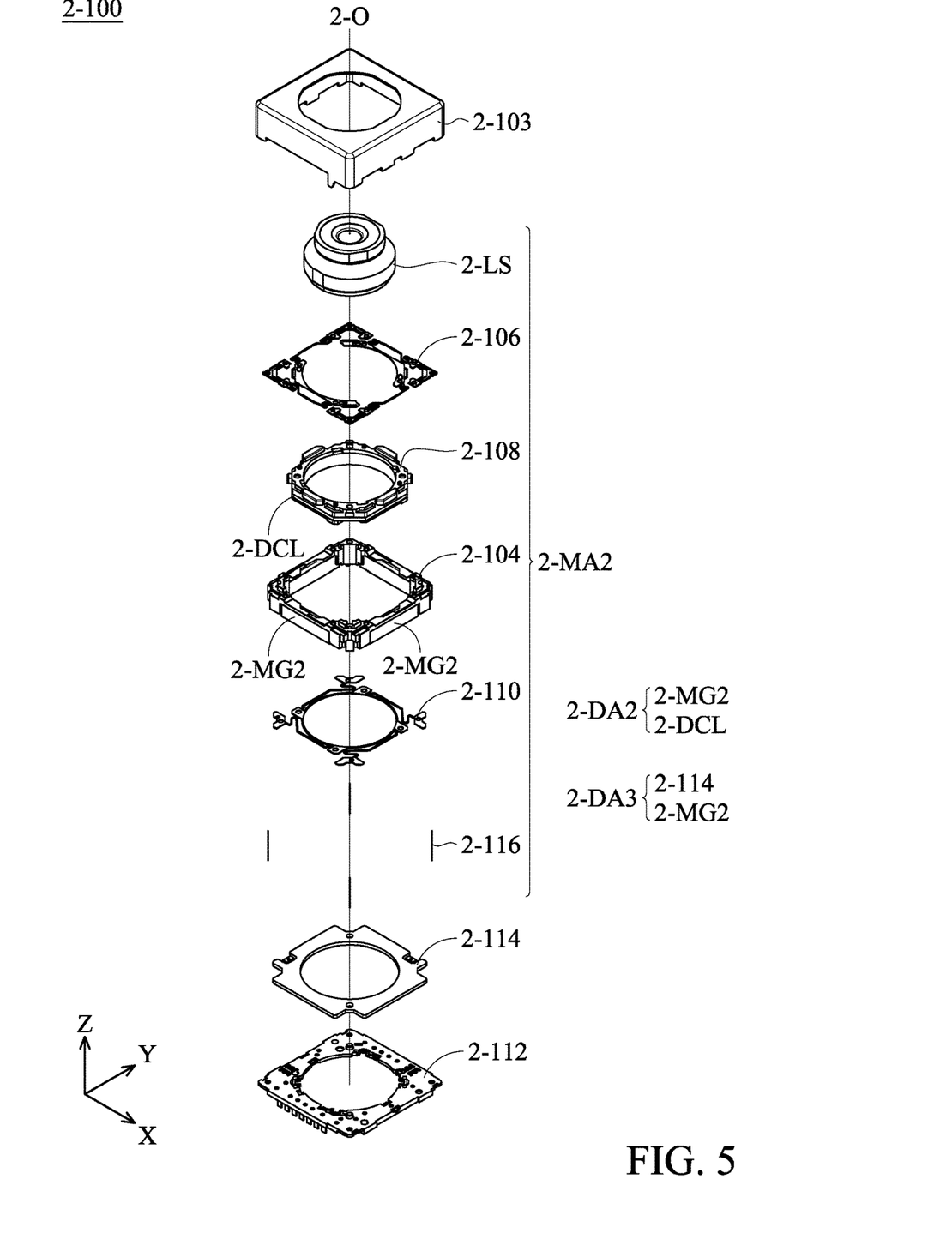
FIG. 5 is an exploded diagram of the optical module 100 according to an embodiment of the present disclosure.
Figure 6:
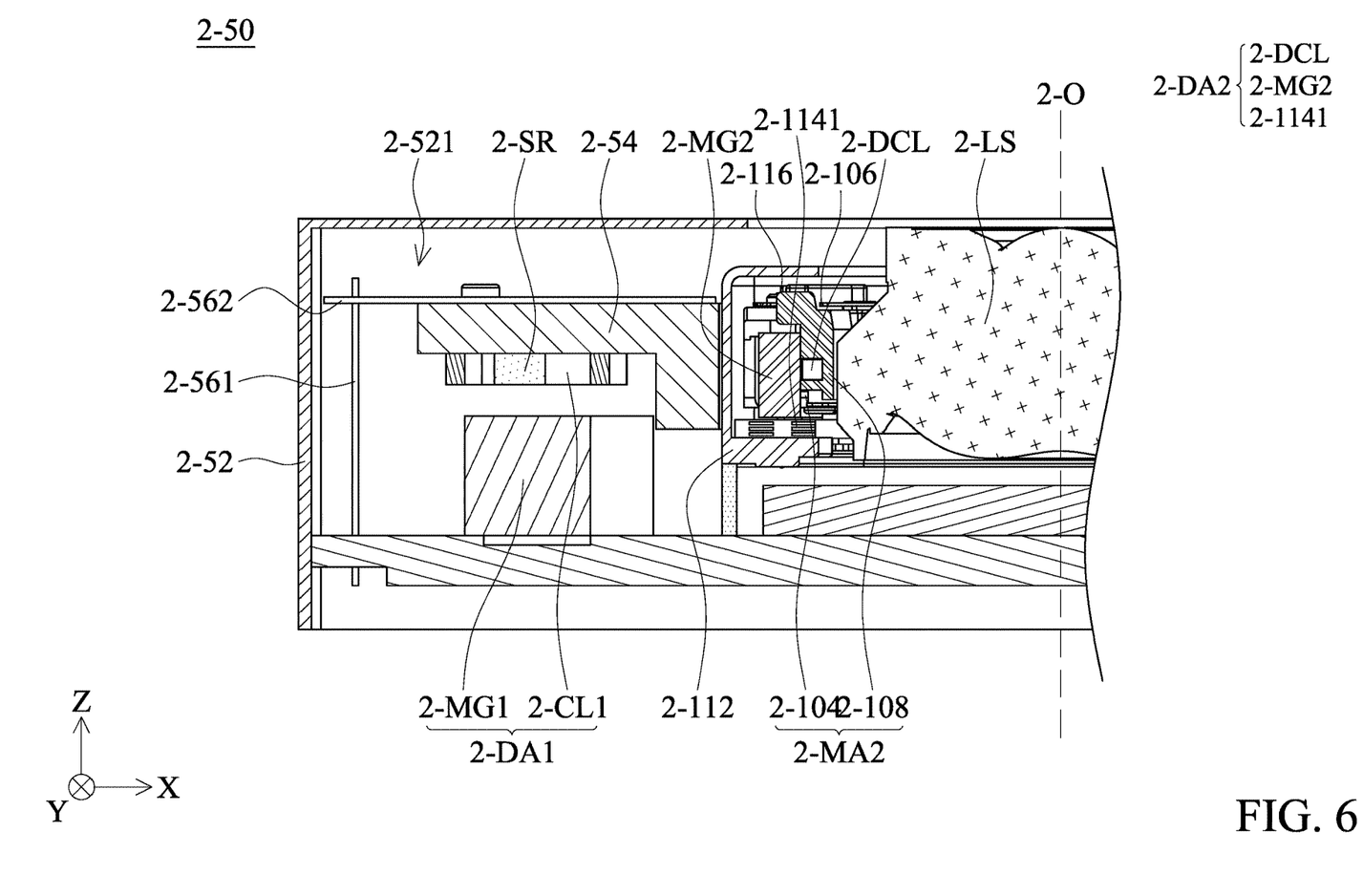
FIG. 6 is an enlarged schematic diagram of the optical system 2-50 according to an embodiment of the present disclosure.

Please refer to FIG. 5 and FIG. 6. FIG. 5 is an exploded diagram of the optical module 2-100 according to an embodiment of the present disclosure, and FIG. 6 is an enlarged schematic diagram of the optical system 2-50 according to an embodiment of the present disclosure.

As shown in FIG. 5 and FIG. 6, the optical module 2-100 includes a casing 2-103 fixedly connected to the base 2-112. In addition, the optical module 2-100 further includes a second movable assembly 2-MA2, a second driving assembly 2-DA2, and a third driving assembly 2-DA3. The second movable assembly 2-MA2 includes a frame 2-104, a holder 2-108, and fourth elastic elements 2-106 and 2-110. The second driving assembly 2-DA2 includes a second driving coil 2-DCL and a plurality of second driving magnets 2-MG2. The second driving magnets 2-MG2 are fixed on the frame 2-104, and the holder 2-108 is configured to hold an optical element 2-LS. The second driving assembly 2-DA2 is configured to drive the movement of the second movable assembly 2-MA2 relative to the first movable assembly and the fixed assembly 2-FA. For example, the second driving coil 2-DCL and the second driving magnets 2-MG2 in the second driving assembly 2-DA2 can generate an electromagnetic driving force to drive the holder 2-108 to move along the optical axis 2-O.

The outer ring portion of the fourth elastic element 2-106 is connected to the frame 2-104, the outer ring portion of the fourth elastic element 2-110 is connected to the base 2-112, and the inner ring portion of the fourth elastic element 2-106 and the inner ring portion of the fourth elastic element 2-110 are connected to the upper and lower sides of the holder 2-108 so that the holder 2-108 is suspended in the frame 2-104. In addition, the second movable assembly 2-MA2 further includes four suspension wires 2-116 (the third elastic elements), one end of the suspension wire 2-116 is connected to the fourth elastic element 2-106, and the other end is connected to the base 2-112, so that the frame 2-104 and the holder 2-108 can move in the X-axis or the Y-axis.

The third driving assembly 2-DA3 includes a circuit board 2-114 and second driving magnets 2-MG2, and the circuit board 2-114 has a third driving coil 2-1141, so that the third driving assembly 2-DA3 is configured to drive the second movable assembly 2-MA2 to move in the X-axis or the Y-axis relative to the base 2-112.

As shown in FIG. 6, the third elastic element (the suspension wire 2-116) has a long strip-shaped structure, and the fourth elastic element has a plate-shaped structure. The frame 2-104 and the holder 2-108 of the second movable assembly 2-MA2 are movably connected to the base 2-112 via the fourth elastic elements 2-106, 2-110 and the suspension wires 2-116, and the base 2-112 and the casing 2-103 are fixedly connected to the supporting frame 2-54 (the first movable assembly).

When viewed in a direction perpendicular to the optical axis 2-O (for example, the X-axis), the first driving assembly 2-DA1 overlaps at least one portion of the second driving assembly 2-DA2. When viewed along the optical axis 2-O, the first driving assembly 2-DA1 does not overlap the second driving assembly 2-DA2.

As shown in FIG. 6, the extending directions of the first elastic element 2-561 and the third elastic element (the suspension wires 2-116) are parallel. The extending directions of the first elastic element 2-561 and the second elastic element 2-562 are not parallel. The extending directions of the first elastic element 2-561 and the fourth elastic element 2-106 are not parallel. The extending directions of the second elastic element 2-562 and the third elastic element (the suspension wires 2-116) are not parallel. The extending directions of the second elastic element 2-562 and the fourth elastic element 2-106 are parallel. The extending direction of the third elastic element (the suspension wires 2-116) and the fourth elastic element 2-106 are not parallel.

In some embodiments of the present disclosure, the second driving assembly 2-DA2 is electrically connected to the first elastic element 2-561, the second elastic element 2-562, the third elastic element, and the fourth elastic element 2-106. For example, the second driving coil 2-DCL can be electrically connected to the metal pins (not shown in the figures) of the base 2-112 via the fourth elastic element 2-106 and the suspension wires 2-116. Electrical lines (not shown in the figure) may be formed on the supporting frame 2-54 by the laser direct structuring technology (LDS), and then the metal pins are electrically connected to the first elastic element 2-561 and the second elastic element 2-562 via the electrical lines.

In other embodiments, the first driving coil 2-CL1 of the first driving assembly 2-DA1 may also be electrically connected to the first elastic element 2-561 and the second elastic element 2-562 by the electrical lines on the supporting frame 2-54.

Figure 7:
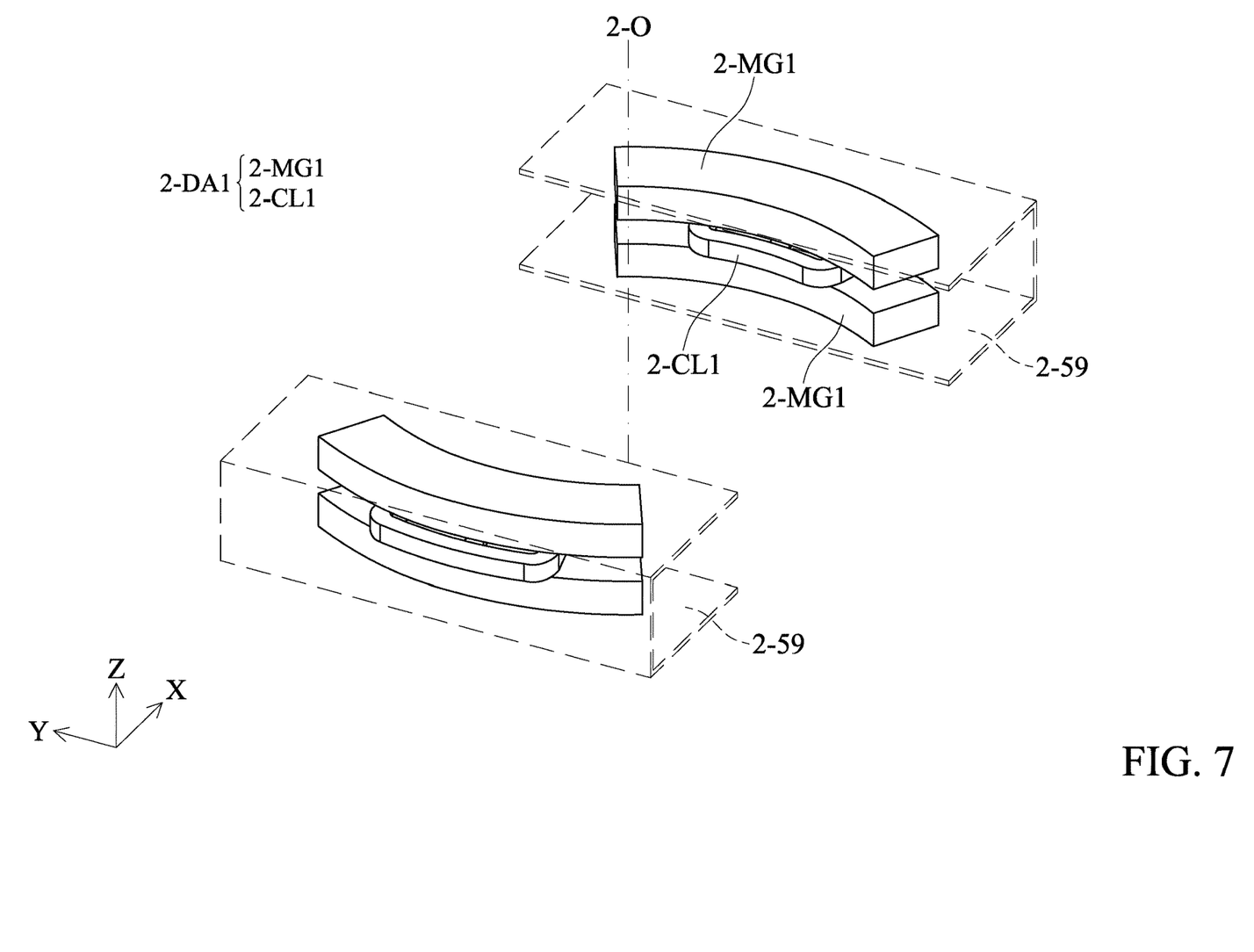
FIG. 7 is a schematic diagram of the first driving assembly 2-DA1 according to another embodiment of the present disclosure.

Please refer to FIG. 7, which is a schematic diagram of the first driving assembly 2-DA1 according to another embodiment of the present disclosure. As shown in FIG. 7, the first driving assembly 2-DA1 includes two sets of first driving magnets, and when viewed along the optical axis 2-O, the two sets of first driving magnets are respectively disposed on two opposite sides of the optical module 2-100. Furthermore, the first driving assembly 2-DA1 may include two magnetic conductive elements 2-59 with a U-shaped structure, and the two sets of first driving magnets are respectively disposed in the two magnetic conductive elements 2-59.

Each set of first driving magnets may include two first driving magnets 2-MG1, and the first driving coil 2-CL1 in the first driving assembly 2-DA1 is disposed between the two first driving magnets 2-MG1 along the Z-axis.

Figure 8:
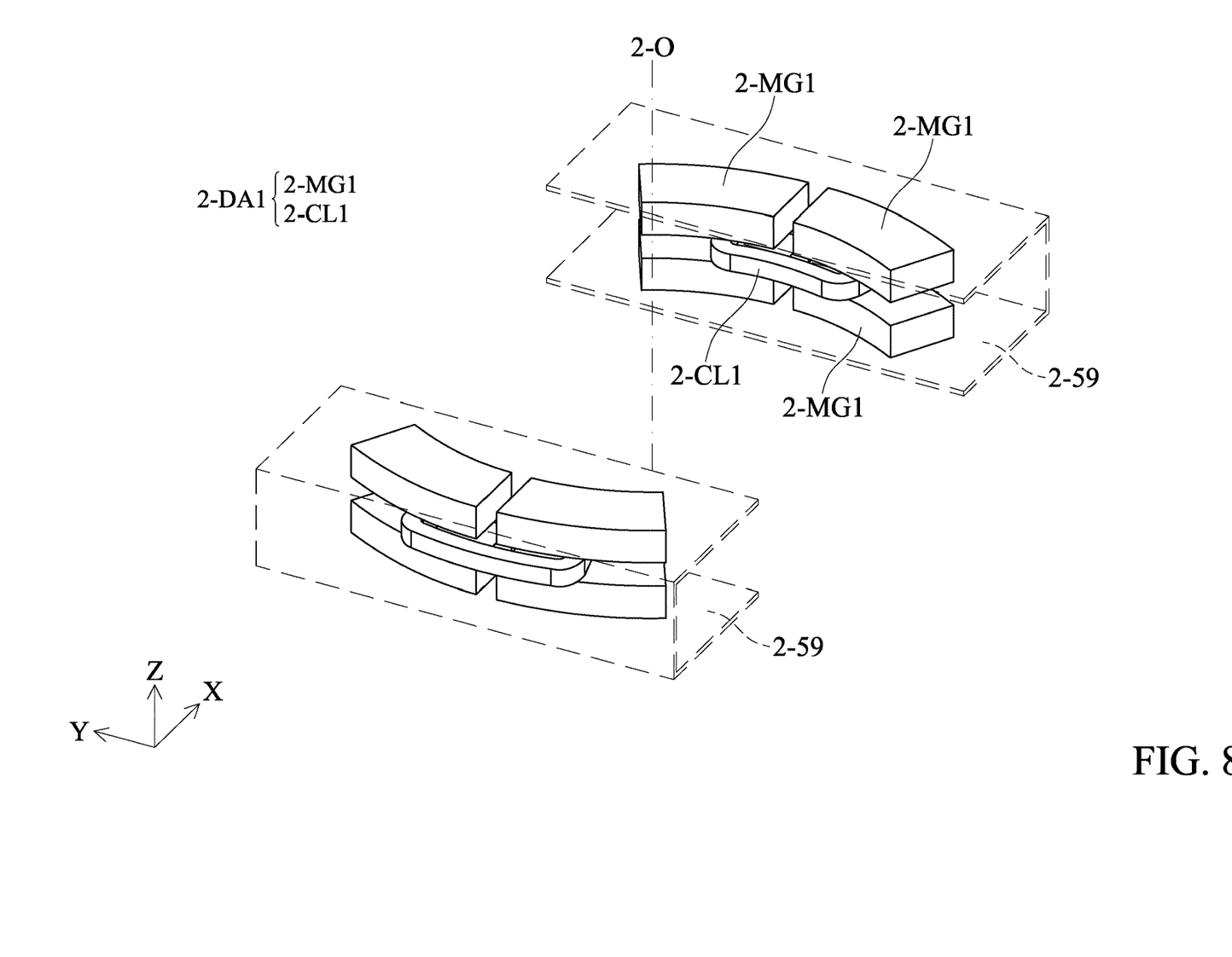
FIG. 8 is a schematic diagram of the first driving assembly 2-DA1 according to another embodiment of the present disclosure.

Please refer to FIG. 8, which is a schematic diagram of the first driving assembly 2-DA1 according to another embodiment of the present disclosure. As shown in FIG. 8, in this embodiment, two sets of first driving magnets are respectively disposed on two opposite sides of the optical module 2-100, and each set of first driving magnets may include four first driving magnets 2-MG1. Two of the first driving magnets 2-MG1 are disposed on one side of the first driving coil 2-CL1, and the other two of the first driving magnets 2-MG1 are disposed on the other side of the first driving coil 2-CL1.

The present disclosure provides an optical system disposed in an electronic device. The optical system includes the optical module 2-100, the supporting frame 2-54, the first elastic elements 2-561, the second elastic elements 2-562, the first driving assembly 2-DA1, and the base 2-58. The supporting frame 2-54 is configured to support the optical module 2-100, and the supporting frame 2-54 is movably connected to the base 2-58 via the first elastic elements 2-561 and the second elastic elements 2-562. When the user uses the electronic device to take pictures and the electronic device is not placed horizontally, the first driving assembly 2-DA1 can drive the supporting frame 2-54 with the optical module 2-100 to rotate around the optical axis 2-O, so as to achieve the purpose of image compensation.

In addition, the circuit assembly 2-70 of the present disclosure is a flexible circuit board, and the thickness direction of the circuit assembly 2-70 is not parallel to the optical axis 2-O. Because the circuit assembly 2-70 is flexible, when the optical module 2-100 rotates around the optical axis 2-O, the circuit assembly 2-70 does not break.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An optical system, comprising:
    a fixed assembly;
    an optical module, having an optical axis;
    a first movable assembly, configured to be connected to the optical module; and
    a first driving assembly, configured to drive the first movable assembly to move relative to the fixed assembly;
    wherein a gap is formed between the first movable assembly and the fixed assembly;
    wherein the optical system further includes a first elastic element and a second elastic element, the first elastic element has a long strip-shaped structure, the second elastic element has a plate-shaped structure, and the first movable assembly is movably connected to the fixed assembly via the first elastic element and the second elastic element;
    wherein the first movable assembly includes a supporting frame configured to hold the optical module fixedly and directly, and there is no gap between the supporting frame and the optical module;
    wherein the second elastic element is fixed to the supporting frame;
    wherein when viewed in a direction parallel to the optical axis, the first elastic element and the second elastic element do not overlap the optical module;
    wherein when viewed in the direction parallel to the optical axis, the second elastic element covers an upper surface of the supporting frame, and the first elastic element passes through the second elastic element.

2. The optical system as claimed in claim 1, wherein the optical module further includes:
    a second movable assembly, configured to be connected to an optical element;
    a photosensitive element, corresponding to the optical element; and
    a second driving assembly, configured to drive the second movable assembly to move relative to the first movable assembly and the fixed assembly, and when viewed in a direction perpendicular to the optical axis, the first driving assembly overlaps at least one portion of the second driving assembly.

3. The optical system as claimed in claim 2, wherein when viewed along the optical axis, the first driving assembly does not overlap the second driving assembly.

4. The optical system as claimed in claim 1, wherein the first driving assembly further includes a first driving magnet and a first driving coil, and when viewed in a direction perpendicular to the optical axis, the first driving magnet does not overlap and the first driving coil, and
    wherein when viewed in a direction parallel to the optical axis, all of the supporting frame is located between the optical module and the first elastic element;
    wherein when viewed in the direction parallel to the optical axis, the first elastic element does not overlap the supporting frame.

5. The optical system as claimed in claim 1, wherein the first driving assembly includes:
    a first driving coil, including a first linear segment and a second linear segment, wherein each of the first linear segment and the second linear segment has a linear structure, and the first linear segment is neither parallel nor perpendicular to the second linear segment; and
    a first driving magnet, corresponding to the first driving coil.

6. The optical system as claimed in claim 5, wherein the first driving magnet has an arc-shaped surface.

7. The optical system as claimed in claim 6, wherein the first driving assembly is configured to drive the first movable assembly to rotate around a first axis relative to the fixed assembly, and the first axis is parallel to the optical axis.

8. The optical system as claimed in claim 1, wherein the optical system further includes a circuit assembly which has a plate-shaped structure and is electrically connected to the optical module, and a thickness direction of the circuit assembly is not parallel to the optical axis.

9. The optical system as claimed in claim 1, wherein the optical module further includes:
    a second movable assembly, configured to be connected to an optical element;
    a photosensitive element, corresponding to the optical element;
    a second driving assembly, configured to drive the second movable assembly to move relative to the first movable assembly and the fixed assembly;
    a third elastic element, having a long strip-shaped structure; and
    a fourth elastic element, having a plate-shaped structure, wherein the second movable assembly is movably connected to the first movable assembly via the third elastic element and the fourth elastic element.

10. The optical system as claimed in claim 9, wherein extending directions of the first elastic element and the third elastic element are parallel.

11. The optical system as claimed in claim 10, wherein the second driving assembly is electrically connected to the first elastic element, the second elastic element, the third elastic element, and the fourth elastic element.

12. The optical system as claimed in claim 10, wherein the first driving assembly is electrically connected to the first elastic element and the second elastic element.

13. The optical system as claimed in claim 9, wherein the optical system further includes a first position sensing assembly configured to sense movement of the first movable assembly relative to the fixed assembly, and the first position sensing assembly is electrically connected to the first elastic element and the second elastic element.

14. The optical system as claimed in claim 13, wherein the first position sensing assembly includes a first position sensor, which is fixedly disposed on the first movable assembly.

15. The optical system as claimed in claim 1, wherein the first driving assembly includes two first driving magnets, and when viewed along the optical axis, the two first driving magnets are disposed on two opposite sides of the optical module.

16. The optical system as claimed in claim 1, wherein the first driving assembly includes two sets of first driving magnets, and when viewed along the optical axis, the two sets of first driving magnets are respectively disposed on two opposite sides of the optical module.

17. The optical system as claimed in claim 16, wherein the first driving assembly includes two magnetic conductive elements, and the two sets of first driving magnets are respectively disposed in the two magnetic conductive elements.

18. The optical system as claimed in claim 17, wherein each set of first driving magnets comprises two first driving magnets, and the first driving assembly further includes a first driving coil disposed between the two first driving magnets.

19. The optical system as claimed in claim 1, wherein the optical system further includes a control circuit configured to control the first driving assembly to drive the first movable assembly to move relative to the fixed assembly according to an image signal or an inertial signal.

20. An optical system, comprising:
a fixed assembly;
an optical module, having an optical axis;
a first movable assembly, configured to be connected to the optical module; and
a first driving assembly, configured to drive the first movable assembly to move relative to the fixed assembly;
wherein a gap is formed between the first movable assembly and the fixed assembly;
wherein the first driving assembly includes:
a first driving coil, including a first linear segment and a second linear segment, wherein each of the first linear segment and the second linear segment has a linear structure, and the first linear segment is neither parallel nor perpendicular to the second linear segment; and
a first driving magnet, corresponding to the first driving coil;
wherein the first driving magnet has an arc-shaped surface;
wherein the first driving assembly is configured to drive the first movable assembly to rotate around a first axis relative to the fixed assembly, and the first axis is parallel to the optical axis.

21. An optical system, comprising:
a fixed assembly;
an optical module, having an optical axis;
a first movable assembly, configured to be connected to the optical module; and
a first driving assembly, configured to drive the first movable assembly to move relative to the fixed assembly;
wherein a gap is formed between the first movable assembly and the fixed assembly;
wherein the optical system further includes a first elastic element and a second elastic element, the first elastic element has a long strip-shaped structure, the second elastic element has a plate-shaped structure, and the first movable assembly is movably connected to the fixed assembly via the first elastic element and the second elastic element;
wherein the first movable assembly includes a supporting frame configured to hold the optical module;
wherein the second elastic element is fixed to the supporting frame;
wherein when viewed in a direction parallel to the optical axis, the first elastic element and the second elastic element do not overlap the optical module;
wherein the optical module further includes:
a second movable assembly, configured to be connected to an optical element;
a photosensitive element, corresponding to the optical element;
a second driving assembly, configured to drive the second movable assembly to move relative to the first movable assembly and the fixed assembly;
a third elastic element, having a long strip-shaped structure; and
a fourth elastic element, having a plate-shaped structure, wherein the second movable assembly is movably connected to the first movable assembly via the third elastic element and the fourth elastic element.

* * * * *